United States Patent [19]
Nishizawa

[11] Patent Number: 4,673,985
[45] Date of Patent: Jun. 16, 1987

[54] SEMICONDUCTOR IMAGE SENSOR
[75] Inventor: Jun-ichi Nishizawa, Sendai, Japan
[73] Assignee: Fuji Photo Film Co., Ltd., Minami-ashigara, Japan
[21] Appl. No.: 610,283
[22] PCT Filed: Sep. 9, 1983
[86] PCT No.: PCT/JP83/00303
 § 371 Date: May 9, 1984
 § 102(e) Date: May 9, 1984
[87] PCT Pub. No.: WO84/01076
 PCT Pub. Date: Mar. 15, 1984
[30] Foreign Application Priority Data
 Sep. 9, 1982 [JP] Japan .................... 57-157693
[51] Int. Cl.$^4$ .................. H04N 3/12; H01L 29/80
[52] U.S. Cl. ................... 358/213.12; 357/22; 357/30
[58] Field of Search ............. 357/51, 30, 31, 22, 357/45; 358/213, 212

[56] References Cited
U.S. PATENT DOCUMENTS
4,245,231 1/1981 Davies .................................. 357/52
4,429,325 1/1984 Takasaki et al. .................... 357/31
4,496,963 1/1985 Dunkley et al. ..................... 357/52
4,502,203 3/1985 Nishizawa et al. .................. 357/30

FOREIGN PATENT DOCUMENTS
2060257 4/1981 Japan ............................. 357/52 D
0150878 11/1981 Japan ............................... 350/30

OTHER PUBLICATIONS
Nishizawa et al., "Static Induction Transistor Image Sensors," *IEEE Transactions on Electron Devices*, vol. ED-26, No. 12, (12/79).

Primary Examiner—James W. Davie
Attorney, Agent, or Firm—Staas & Halsey

[57] ABSTRACT

A semiconductor image sensor is formed by static induction transistors, each provided with a control gate region which is a first gate region for control use and a shielding gate region which is a second gate region. The distance between an n+ source region and the control gate region is larger than the distance between the n+ source region and the shielding gate region. It is also possible to adopt such a structure that a light-shielding mask is provided on the shielding gate region. The isolation of adjacent photoconductive cells and the integration of adjacent photoconductive cells are improved, and the integration density is sharply increased.

36 Claims, 18 Drawing Figures

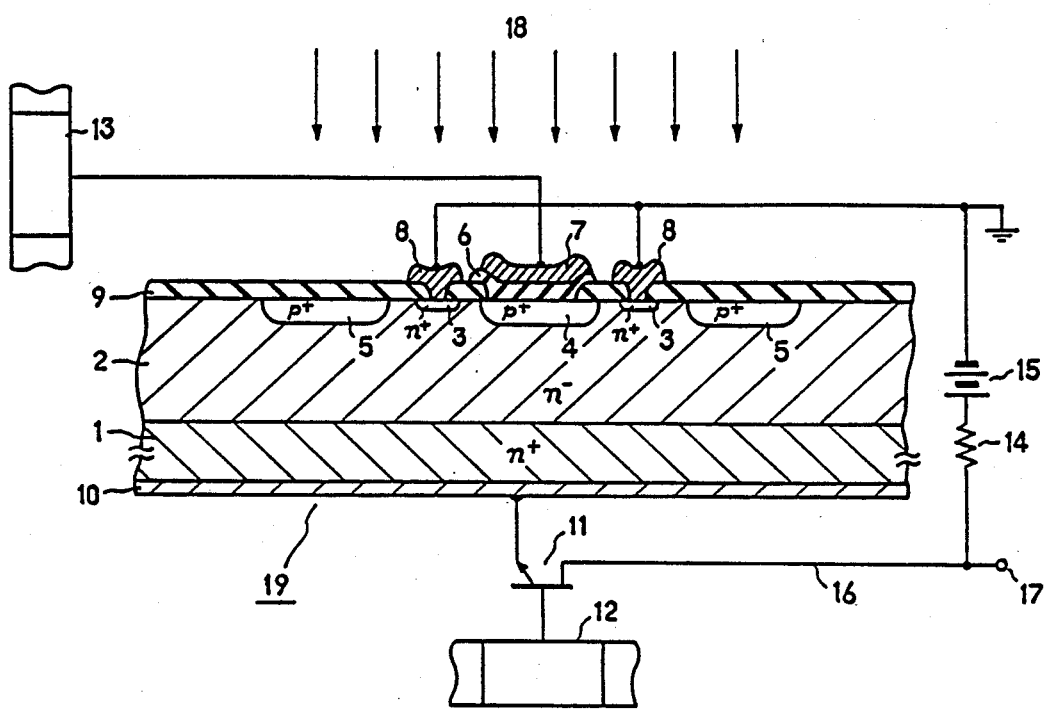
FIG. 1B
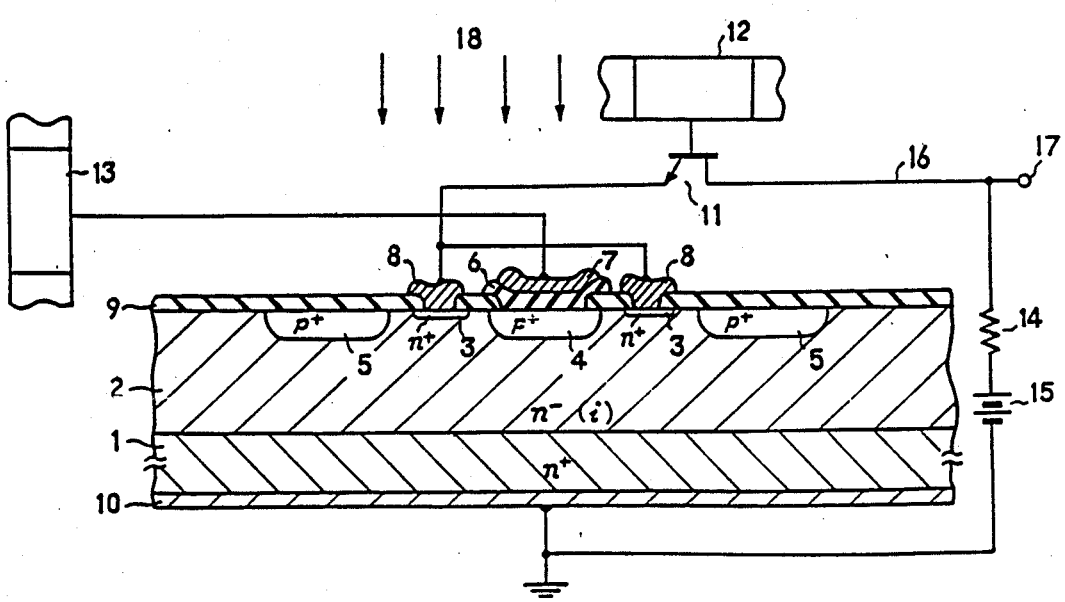

SEMICONDUCTOR IMAGE SENSOR

BACKGROUND OF THE INVENTION

A semiconductor image sensor is characterized in each cell has a photo detecting section sensitive to light and having a light amplifying function and a switch for matrix selecting use is formed by a single transistor, that is, each cell is formed by a static induction transistor featuring high sensitivity and high-speed operation.

Conventional semiconductor image sensors have each cell comprised of a diode for photodetecting use and a MOS transistor for switching use and performs photodetection by the diode, and hence has the defect of low sensitivity.

Further, they have such a drawback that since the MOS transistor is employed for switching, switching noise is larger than a light signal and a circuit for removing noise is complex. For these reasons, the use of the cell comprised of the photodetecting diode and the MOS transistor imposes limitations on the integration density of the image sensor in terms of sensitivity.

The present inventor has already disclosed in Japanese Pat. Appln. No. 204656/81 a one cell-one transistor type semiconductor device which employs the same static induction transistor of high photosensitivity both for photodetection and for switching. But the disclosed SIT image sensor lacked concreteness in a method of operation and a method of signal separation between cells.

The present invention is to provide a novel semiconductor image sensor by the introduction of a novel cell structure for improving the method of signal separation between cells and raising the integration density in the disclosed semiconductor image sensor.

Conventional semiconductor image sensors are shown FIGS. 1A and B. In FIGS. 1A and B, reference numeral 1 indicates a silicon n+ substrate, 2 a high resistance n− layer of an intrinsic semiconductor region, 3 a high impurity density n+ region which will ultimately serve as a source or drain, 4 a high impurity density p+ region which will ultimately serve as a first gate, and 5 a high impurity density p+ region which will ultimately serve as a second gate. Reference numeral 8 designates a source or drain electrode, 10 a drain or source electrode, 6 a film of an insulating material such as an $SiO_2$, $Si_3N_4$ or the like, 7 a first gate electrode, and 9 a surface protective film such as an $SiO_2$ film or the like. Reference numeral 11 identifies a switching transistor, and 12 a circuit which generates a pulse voltage $\phi_s$ for video line selection which controls the switching transistor 11. Reference numeral 13 denotes an address circuit which generates a pulse voltage $\phi_G$ which is supplied to the first gate for readout, 14 a load resistor of the switching transistor, 15 a video voltage source for a photoconductive cell section, and 16 wiring (a video line) to the switching transistor 11 and the load resistor 14. Reference numeral 18 represents an optical input.

The high impurity density p+ region 5 of the second gate is held in an electrically floating state, or retained at a fixed voltage by a predetermined bias circuit.

In FIG. 1A, the surface n+ region 3 and its electrode 8 are grounded, whereas in FIG. 1B the n+ substrate region 1 is grounded.

FIG. 1C shows a readout circuit of one cell as in FIG. 1A. In FIG. 1A, since the high impurity density n+ region 3 which will ultimately form the source is grounded, the source of the SIT is grounded also in FIG. 1C. In the readout circuit of one cell as in FIG. 1B, though not shown, the indication of the SIT is the reverse from that in the above case, since the n+ substrate region which serves as an n+ drain is grounded. Accordingly, the operation of the SIT is the reverse from that of the SIT in the above case.

In FIG. 1C, when the pulse voltage $\phi_s$ is applied to the base or gate of the transistor 11 to cause it to conduct and the voltage of the video voltage source 15 is provided to a phototransistor 19 shown in the sectional view of FIG. 1A, an optical signal is written by the optical input 18. At this time, the voltage $\phi_G$ is not being supplied. When the voltage $\phi_G$ is applied to conduct the phototransistor 19, a drain current is produced corresponding to the optical input 18, obtaining an optical output signal from an output terminal 17. The optical output at the output terminal 17 varies in accordance with the intensity of the optical input 18; this provides the characteristic of a large dynamic range, leading to such a feature that the light amplification factor is larger than those obtainable with conventional bipolar transistors.

FIG. 1D shows an example of the optical dynamic characteristic of one cell of the image sensor of the SIT shown in FIG. 1B. The device measures about $50 \times 55\mu$ and has a gate storage capacitance of approximately 5 pF and a light integration time of 25 msec.

In the phototransistors shown in section in FIGS. 1A and B, the distance $W_1$ between the high impurity density p+ region 4 serving as the first gate and the high impurity density n+ region 3 serving as the source and the distance $W_2$ between the p+ region 5 serving as the second gate and the n+ region 3 of the source are substantially equal, and optically excited carriers are stored in the first and second gates with substantially the same probability, so that voltage variations of the first and second gates make substantially the same contribution to a source-to-drain signal current.

The reason for this is that since a diffusion potential $V_{b1}$ between the p+ region 4 of the first gate and the n+ region 3 of the source and a diffusion potential $V_{b2}$ between the p+ region 5 of the second gate and the n+ region 3 of the source are nearly equal, the potential barriers of the first gate 4 and the second gate 5 with respect to the source are reduced substantially the same extent when the optical signal 18 is applied. Therefore, even if the second gate is floating, a photoelectric conversion current flows in the channel region between the second gate 5 and the n+ region 3 of the source to substantially the same extent as in the channel region between the first gate 4 and the n+ region 3 of the source owing to the lowered potential barrier, making it impossible to fix the potential of the second gate 5 with respect to the channel.

SUMMARY OF THE INVENTION

The present invention is intended to obviate the abovesaid defect of the conventional semiconductor image sensor. A first feature of the present invention resides in that a second gate region (hereinafter referred to as a shielding gate region) is provided, separately of a first gate region for control use (hereinafter referred to as a control gate region), for ensuring isolation of adjacent photoconductive cells. A second feature of the present invention lies in that the light receiving area of a p+i (n−, ν)n+ diode formed by the control gate region, one main electrode and a channel is increased, thereby decreasing the required area of a unit picture cell to provide for enhanced integration density.

Also it is one of the features of the present invention to introduce a structure wherein only the control gate region has photo sensitivity and the shielding gate region is used only for isolation of adjacent cells.

BRIEF DESCRIPTION OF THE DRAWINGS

FIGS. 1A and B are both diagrams showing the sectional structures of conventional static induction transistor (SIT) image sensors;

FIG. 9 is a graph showing the optical dynamic characteristics of the SIT image sensors based on the embodiments of the present invention.

DESCRIPTION OF PREFERRED EMBODIMENTS

Figure 1C:
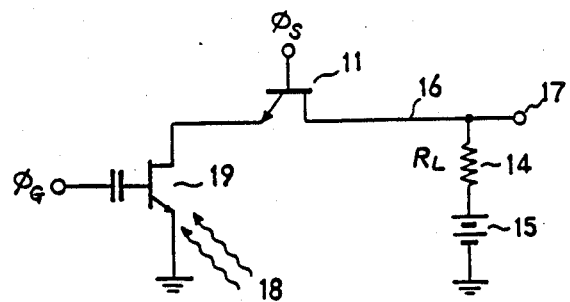
FIG. 1C shows a one cell (one pixel) readout circuit.
Figure 1D:
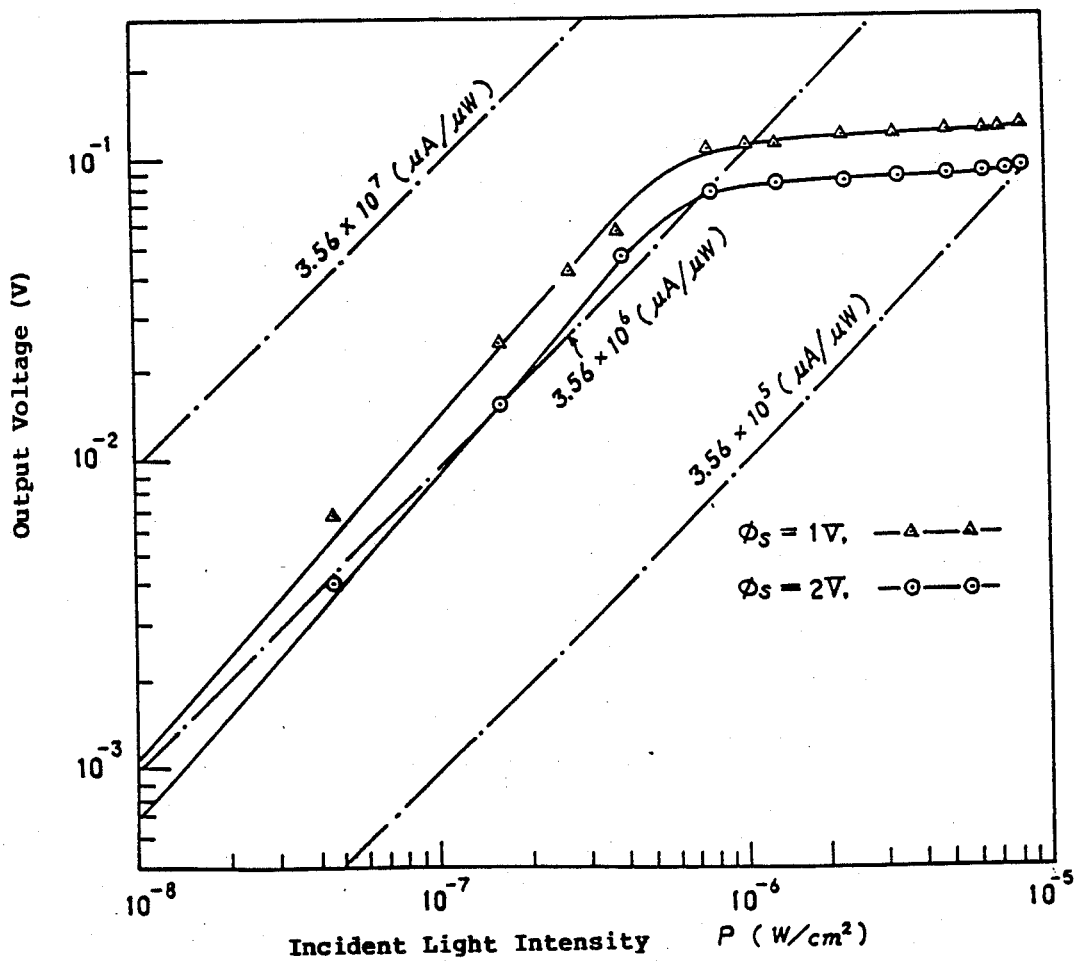
FIG. 1D is a graph showing an example of the optical dynamic characteristic of one cell of the conventional reverse-operation SIT image sensor.
Figure 2A:
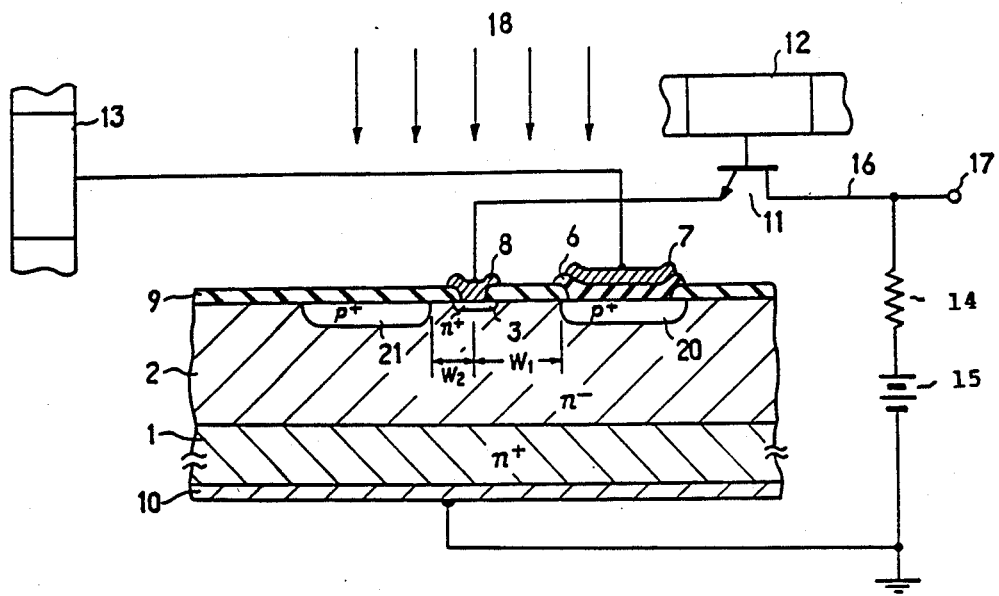
FIGS. 2A and B are diagrams illustrating the sectional structures of a first pair of related embodiments of the SIT image sensor of the present invention.
Figure 2B:
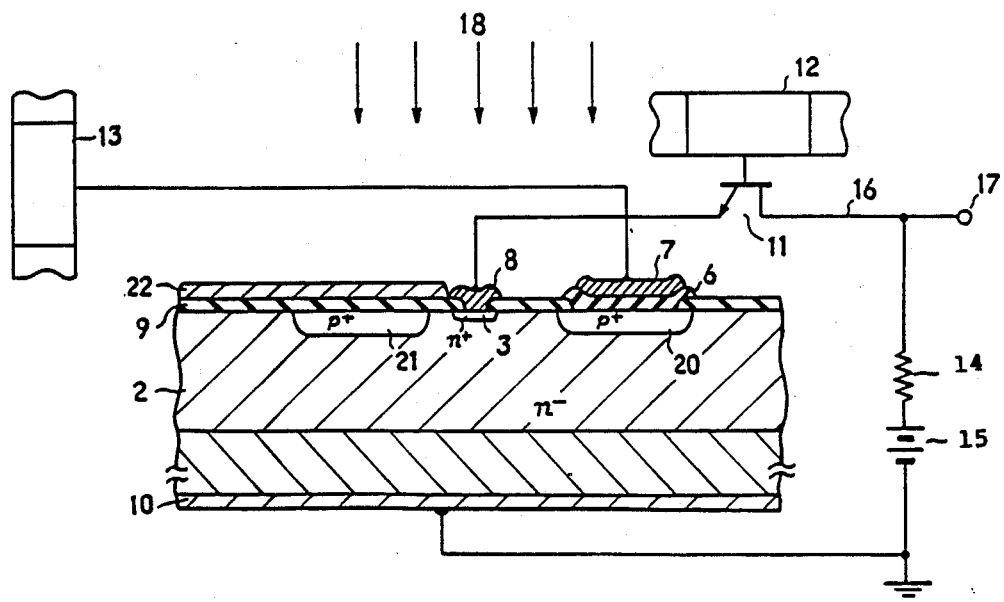

With reference to the drawings, the present invention will hereinafter be described in detail. FIGS. 2A and 2B illustrate basic embodiments of the present invention. These sectional views each show the photoconductive cell of the static induction transistor for light receiving use, and the external circuit is the same as that shown in FIG. 1B. Reference numeral 20 indicates a p-type high-impurity density (higher than $1 \times 10^{17}$ cm$^{-3}$) control gate region, which is spaced a distance $W_1$ apart from the n$^+$ source region 3. Reference numeral 21 designates a p-type high-impurity (higher than $1 \times 10^{17}$ cm$^{-3}$) shielding gate region, which is spaced apart from the n$^+$ source region a distance $W_2$ smaller than the distance $W_1$. Since the other arrangements are identical to those of the conventional semiconductor image sensor shown in FIGS. 1A to 1D, no description will be given of them.

In order to make the control gate region alone photosensitive and to provide the shielding gate region with a very low photosensitivity characteristic, there has been proposed an improved structure in which, for example, the distance $W_1$ is selected larger than the distance $W_2$ to reduce the diffusion potential between the control gate region 20 and the source region 3 to a lower value than the diffusion potential between the shielding gate region 21 and the source region 3, and the impurity density of the shielding gate region 21 is selected to be one order of magnitude larger than the impurity density of the control gate region 20.

When the optical input 18 is applied to the photoconductive cell, electrons of electron-hole pairs created in the channel flow to reach the n$^+$ substrate region 1 which is the drain region. Holes flow to reach the control gate region 20 of a low diffusion potential, charging the control gate region 20 positive. The potential between the control gate region 20 and the source region 3 drops, thus effectively amplifying the light. On the other hand, since the diffusion potential between the shielding gate region 21 and the source region 3 is higher than the diffusion potential between the control gate region 20 and the n$^+$ source region 3, and since the light receiving area of the diode around the shielding gate region 21 is small, the light amplification factor is provided by voltage variations of the shielding gate region 21 which are caused by the light irradiation. With the introduction of such a novel photoconductive cell structure, as compared with the conventional photoconductive cell shown in FIGS. 1A and B, the distance between the source region and the shielding gate region can be reduced to markedly increase the integration density and image sensor cells arranged in a matrix form can be isolated more effectively.

Of course, the FIG. 2A embodiment, in which the n$^+$ substrate region 1 is used as the source region, can be put to practical use, as depicted in FIG. 1A.

The embodiments of the present invention are divided into those in which the n$^+$ region 3 forming the one major surface, which is irradiated by light, is used as the source region, and those in which the n$^+$ substrate region 1 forming the other major surface, which is not irradiated by light, is used as the source region. Since both types are identical in operation, a description will be given of only one of them, as in the case of the embodiment shown in FIG. 2A. FIG. 2B illustrates an embodiment of the present invention, in which a light shielding mask 22 as of aluminum is formed on the shielding gate region to prevent light from entering thereinto from above in the structure of FIG. 2A. It is desirable that the impurity densities of the n$^+$ substrate region 1 and the n$^+$ region 3 be in the approximate range of $10^{17}$ to $10^{20}$ cm$^{-3}$ and as high as possible. The impurity density of the channel region is lower than about $10^{16}$ cm$^{-3}$ and it can be formed as an n$^-$, $\nu$ or intrinsic semiconductor region. The impurity densities of the control gate region 20 and the shielding gate region 21 are selected in the range of around $10^{17}$ to $10^{22}$ cm$^{-3}$. A structure in which the control gate region and the shielding gate region have no particular difference in impurity density therebetween and merely $W_1 > W_2$ is the easiest to manufacture.

The n$^-$ layer 2, which forms the channel region, is formed on the n$^+$ substrate 1, for instance, through a vapor growth method using SiCl$_4$ and H$_2$ gas. The control gate region 20, the shielding gate region 21 and the n$^+$ region 3 are each formed by an ordinary selective boron or phosphorus diffusion method, a selective ion implantation method, or a selective diffusion of polysilicon doped with boron or phosphorus.

A capacitance for connection to the control gate region 20 is formed of SiO$_2$, Si$_2$N$_4$, Al$_2$O$_8$ or AlN, or a compound film thereof. Electrodes 8, 7 and 10 are each formed by vacuum evaporation of Al or Al-Si.

The embodiments illustrated in FIGS. 3A and B are characterized in that the thickness d$_2$ of the shielding gate region 21 is selected to be larger than the thickness $d_1$ of the control gate region 20 so as to make the diffusion potential (hereinafter identified by Vbi(S) between the shielding gate region 21 and the n+ source region 3 higher than the diffusion potential (hereinafter identified by Vbi(C) between the control gate region 20 and the n+ source region 3. Since the p+ shielding gate region 21 is formed deeper than the p+ control gate region 20, the diffusion potentials relative to the source region becomes Vbi(S)>Vbi(C), thus heightening of effect of signal separation between picture elements by the shielding gate region.

Figure 3A:
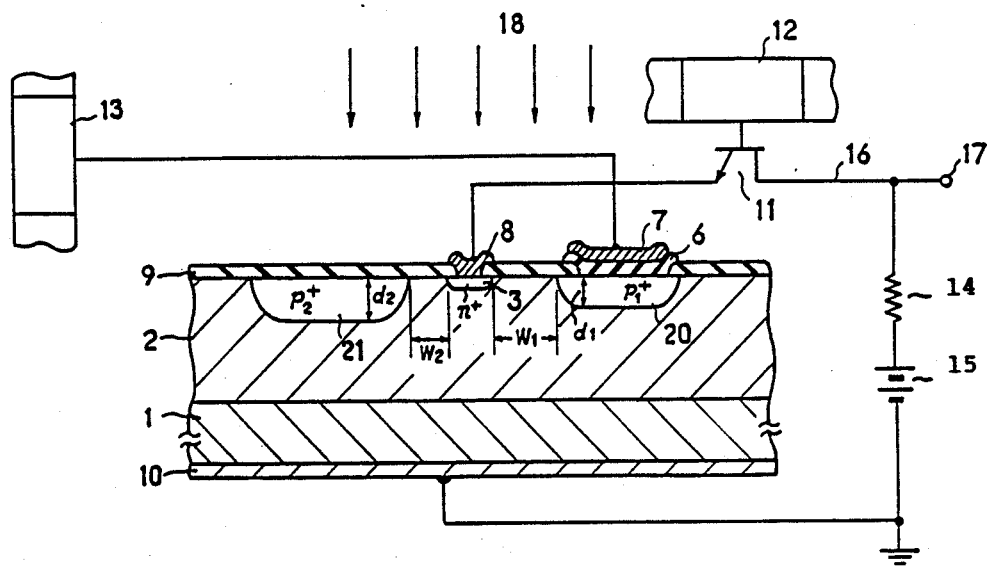
FIGS. 3A and B are diagrams illustrating the sectional structures of a second pair of related embodiments of the present invention.
Figure 3B:
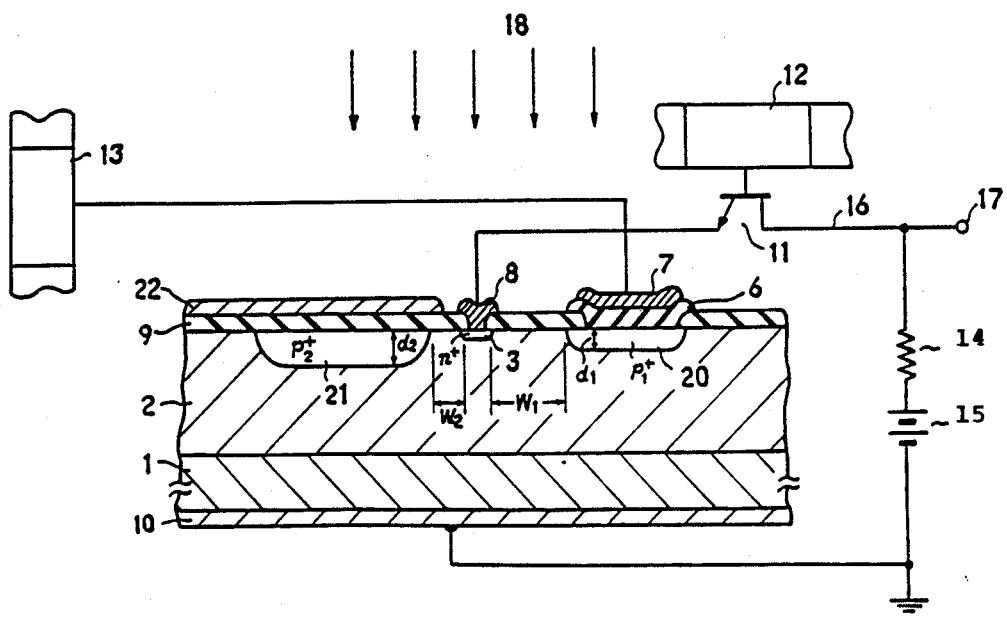

In the embodiment shown in FIG. 3B, the region 22 is a film, for example, an aluminum film, for shielding light which is directed to the shielding gate region 21 and the surrounding channel region. By preventing light from entering the shielding gate region 21 and its vicinity and irradiating only the control gate region 20 and its vicinity, the potential of the shielding gate region is made to be hardly variable by the light and hence remains constant. This effect further ensures the location of adjacent photoconductive cells as, coupled with the deeply diffused shielding gate region 21.

The deep diffusion of the shielding gate region 21 can be achieved by forming first the shielding gate region 21 alone through selective diffusion of boron, by then forming an oxide film on the control gate region through photolithography a selectively diffusing boron.

In the embodiments shown in FIGS. 3A and B, the impurity density of the shielding gate region is $10^{17}$ to $10^{22}$ cm$^{-3}$, the impurity density of the control gate region is also $10^{17}$ to $10^{22}$ cm$^{-3}$ and the impurity densities of the n+ source region 3 and the n+ substrate region 1 are higher than $10^{18}$ cm$^{-3}$.

Figure 4A:
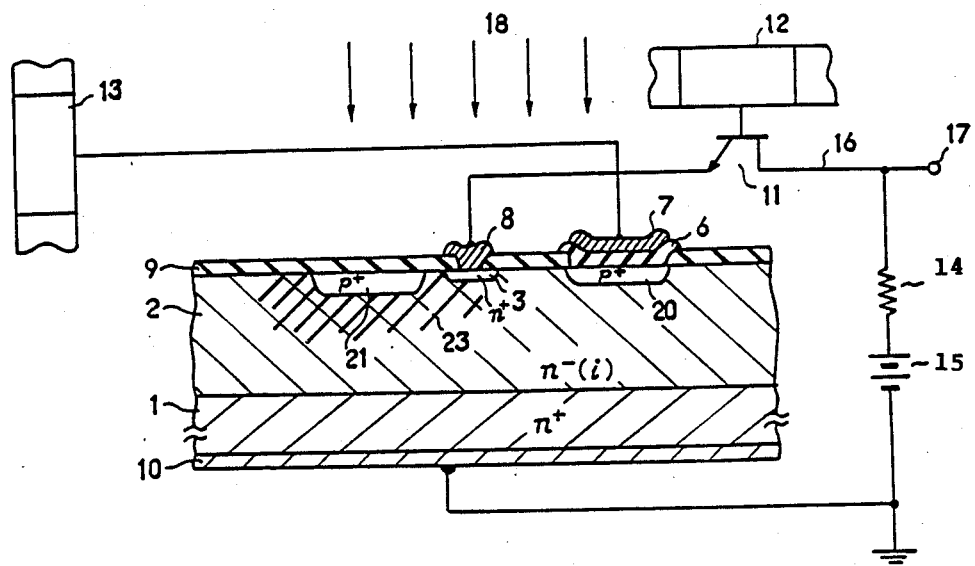
FIGS. 4A and B are diagrams illustrating the sectional structures of a third pair of related embodiments of the present invention.

The embodiments illustrated in FIGS. 4A and B are characterized in that there is provided in the channel region of the n$^-$ layer 2 in the neighborhood of the shielding gate region a region 23 the impurity density of which is increased one or more orders of magnitude over the impurity density of the channel region 2 near the control gate region 20. This impurity density is selected to be $10^{14}$ or $10^{14}$ to $10^{15}$ cm$^{-3}$, for example, when the impurity density of the n$^-$ channel layer 2 is $10^{12}$ or $10^{13}$ cm$^{-3}$.

By raising the diffusion potential Vbi(S) higher than Vbi(C), the light amplification by potential variations of the shielding gate 21 can be markedly reduced as compared with the light amplification by potential variations of the control gate 20.

The high impurity density region 23 in the n$^-$ channel layer 2 can be formed by, for example, known selective ion implantation of phosphorus through a photoresist mask, or by diffusion from phosphorus-doped polysilicon.

Figure 4B:
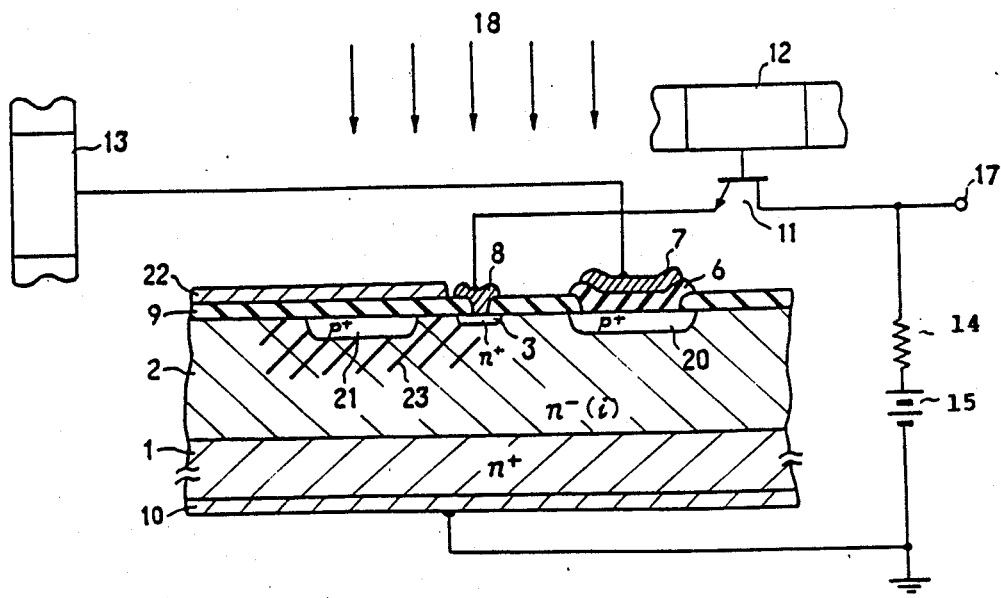

The embodiment shown in FIG. 4B is an example in which, as in the embodiment of FIG. 3B, the shielding gate region 21 and the neighboring channel region are covered with a light shielding film 22 as of aluminum to prevent light from entering thereinto, thus essentially providing photoconductivity only for the control gate region 20 to more effectively accomplish the signal separation between adjacent picture elements by the shielding gate region 21.

Figure 5A:
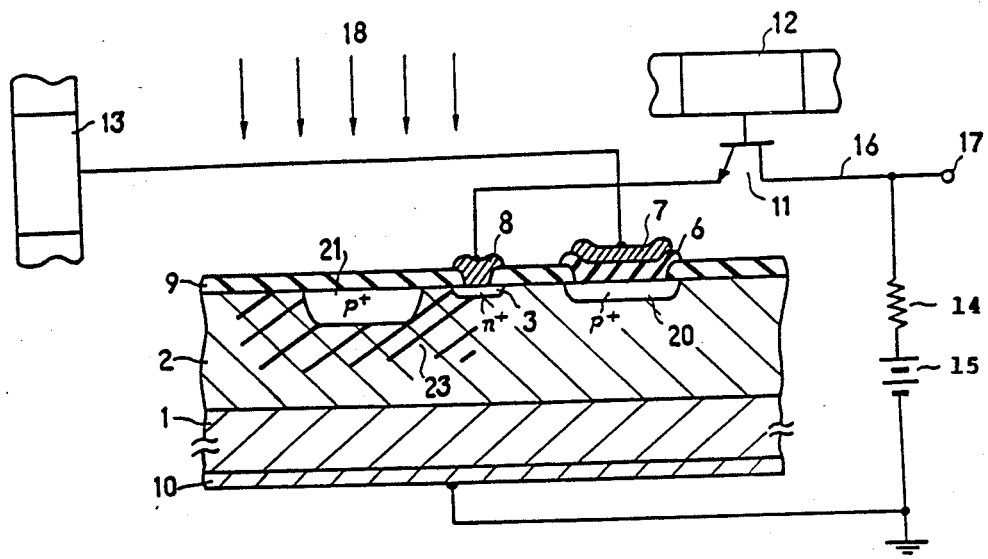
FIGS. 5A and B are diagrams illustrating the sectional structures of a fourth pair of related embodiments of the present invention.

FIGS. 5A and B illustrate other embodiments of the present invention which are combinations of the embodiments of FIGS. 3 and 4. In these embodiments, the depth of the shielding gate region is made greater than the depth of the control gate region and, at the same time, the impurity density of the channel region between the shielding gate region 21 and the n+ drain region 3 is increased one or more orders over the impurity densities of the other channel regions, providing Vbi(S)>Vbi(C).

Figure 5B:
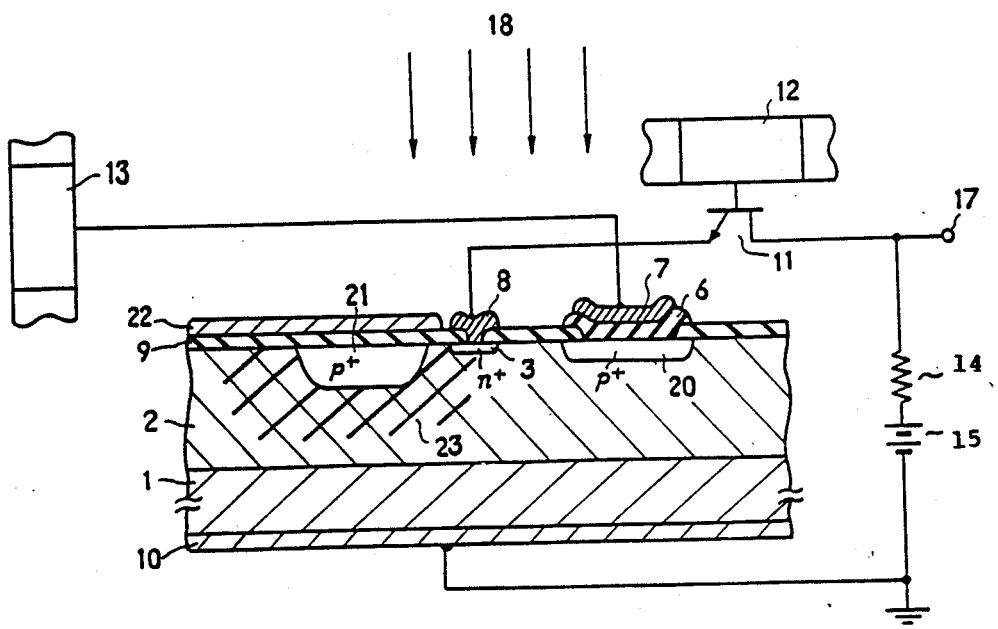

In FIG. 5B, reference numeral 22 indicates a light shielding mask such as an aluminum film or the like, as in FIGS. 3B and 4B.

The embodiments described below are those designed in view of the device structure for arranging a number of photoconductive cells in an m×n matrix. One basic cell is illustrated for each embodiment.

Figure 6A:
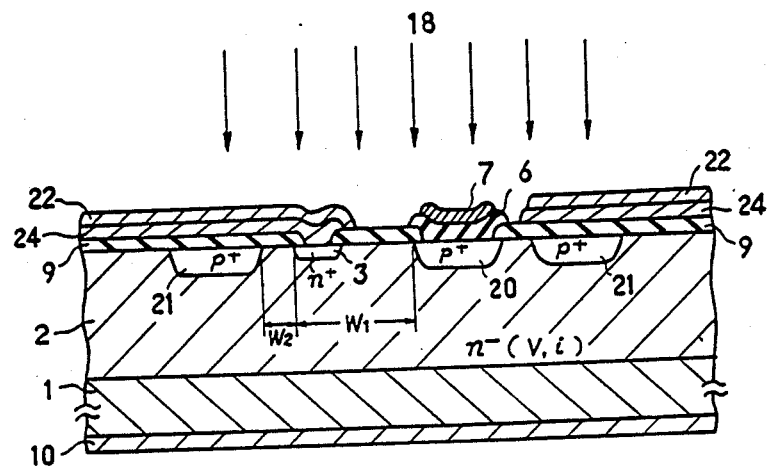
FIGS. 6A to C illustrating the sectional structures of a fifth pair of related embodiments of the present invention.

In FIG. 6A, the photoconductive cell is formed by the p+ control gate region 20 and the n+ source region 3 and is surrounded by the shielding gate region 21 for the signal separation from the adjoining picture elements. The shielding gate region is shielded from the optical input 18, by the insulating film 9, a phosphorus-doped polycrystalline silicon layer 24 serving as an electrode for the n+ source region 3 and the light shielding mask 22 of an aluminum film, so that the optical input 18 is permitted to effectively enter only into the control gate region 20 and the channel in the vicinity of the n+ source region 3.

Figure 6B:
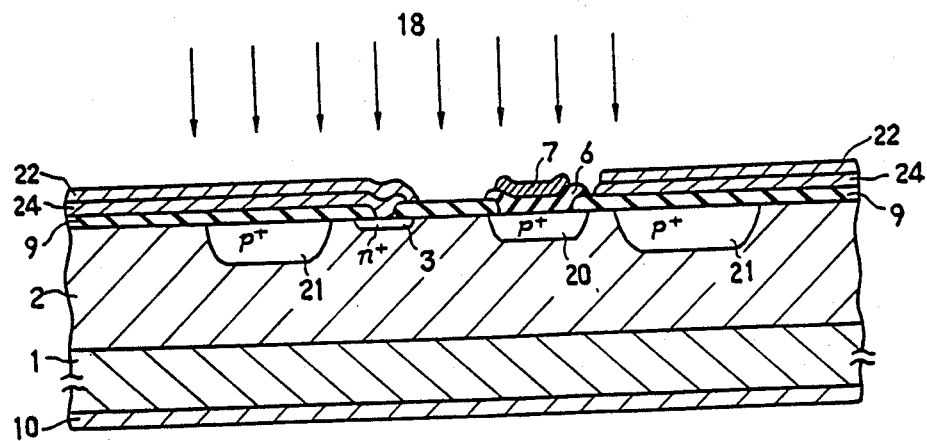
Figure 6C:
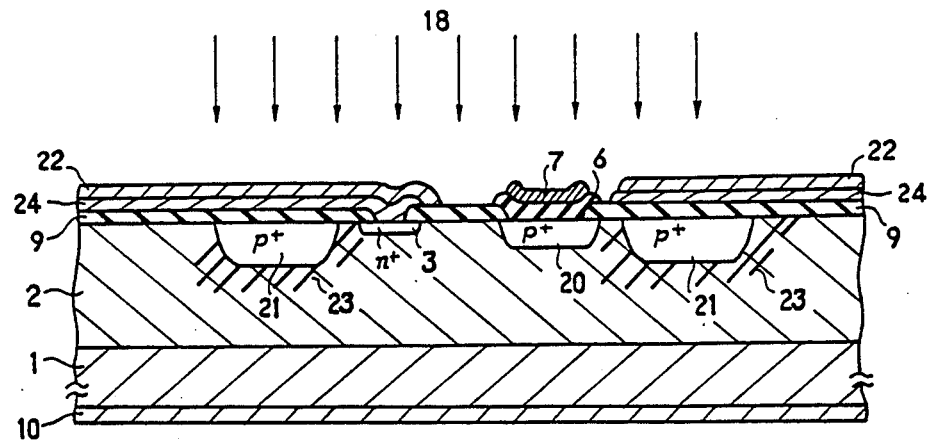

The structure shown in FIG. 6B is identical with the structure of FIG. 6A except that the junction of the shielding gate region 21 is formed deeper than that of the control gate region. FIG. 6C illustrates an embodiment in which there is provided in the channel region near the shielding gate region 21 the region 23 the impurity density of which is about one order of magnitude over the impurity density of the channel region of the n$^-$ layer 2 in the vicinity of the control gate region 20. This embodiment is identical with the embodiment of FIG. 6A except for the above.

Figure 6D:
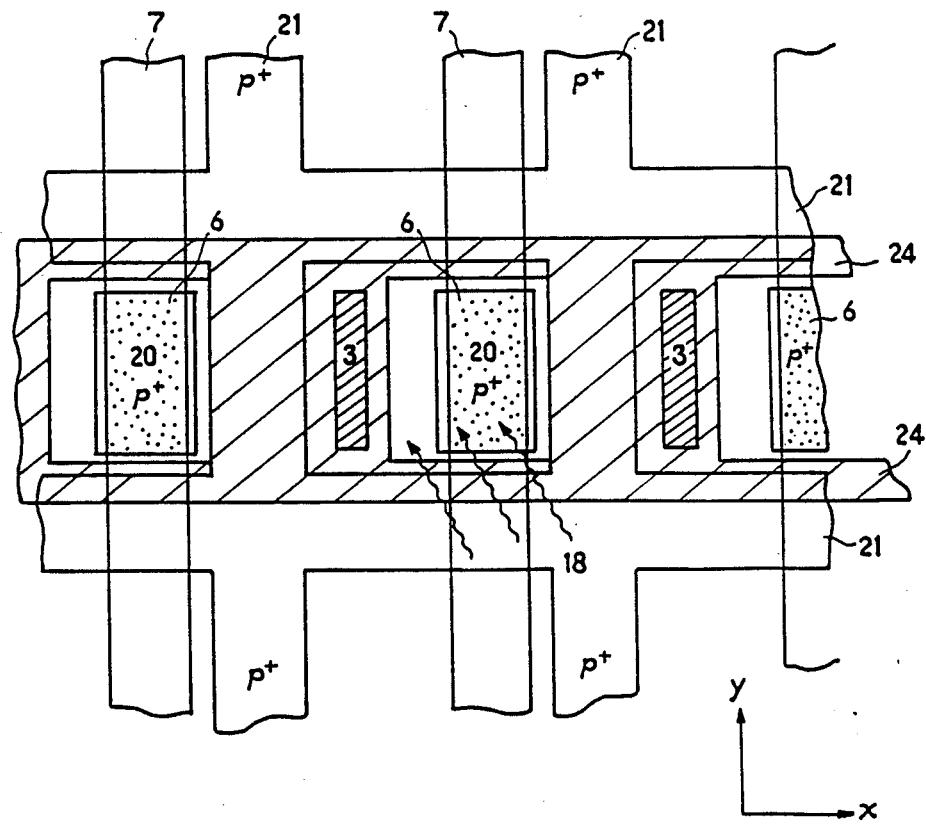
FIG. 6D is a plan view of FIG. 6C.

FIG. 6D is a top plan view of each of the structures shown in FIGS. 6B and C.

In this case, such an arrangement is made that the optical input 18 is permitted to enter into the high resistance channel region between the control gate region 20 and the n+ source region 3 through the thin insulating film 9 shown in FIGS. 6B and C. The electrodes 7 (readout gate pulse address lines), each of which forms a capacitance between it and the control gate region, is arranged to extend in the y direction. The control gate region 20 of each photoconductive cell forms a capacitor together with the electrode 7 through the insulating material 6. It is desirable that the insulating material 6 be a material which is relatively homogeneous and has a large dielectric constant, such as $SiO_2$, SiN, $Ta_2O_5$, or the like. The electrode 7 is formed by a transparent electrode of $SnO_2$, $In_2O_3$ or the like, or polysilicon or silicide. The n+ source regions 3 of adjacent photoconductive cells aligned in the x direction are electrically equipotential and interconnected, and their portions intersecting with the electrodes 7 on the control gates are each insulated therefrom by an inter-layer insulating film such as a CVD $SiO_2$ or PSG film. It is desirable that the portions except the n+ source regions 3 and the control gate regions 20 be shielded by an aluminum film or the like from light to such an extent as not to cause shorting of the x- and y-direction interconnections.

Figure 7:
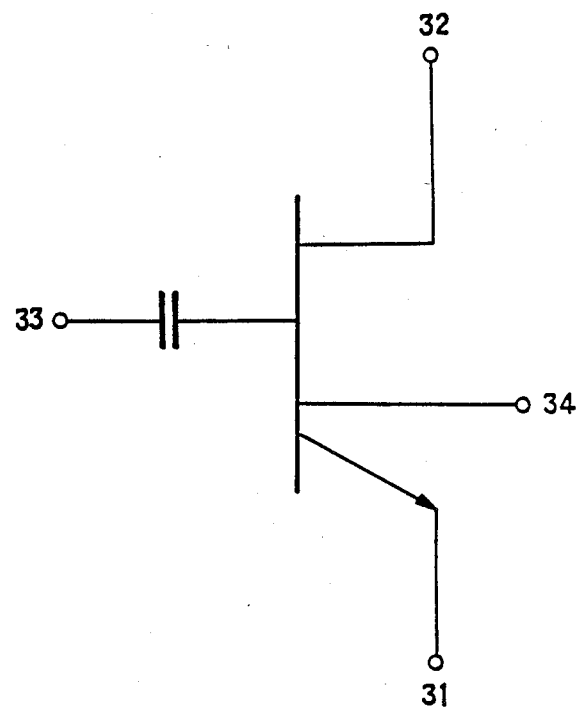
FIG. 7 is a circuit representation of one pixel of the SIT image sensor.

FIG. 7 shows symbols of respective parts of the photoconductive cell of the semiconductor image sensor of the present invention. Reference numerals 31, 32, 33 and 34 indicate electrodes of the source, the drain, the control gate and the shielding gate, respectively.

Figure 8:
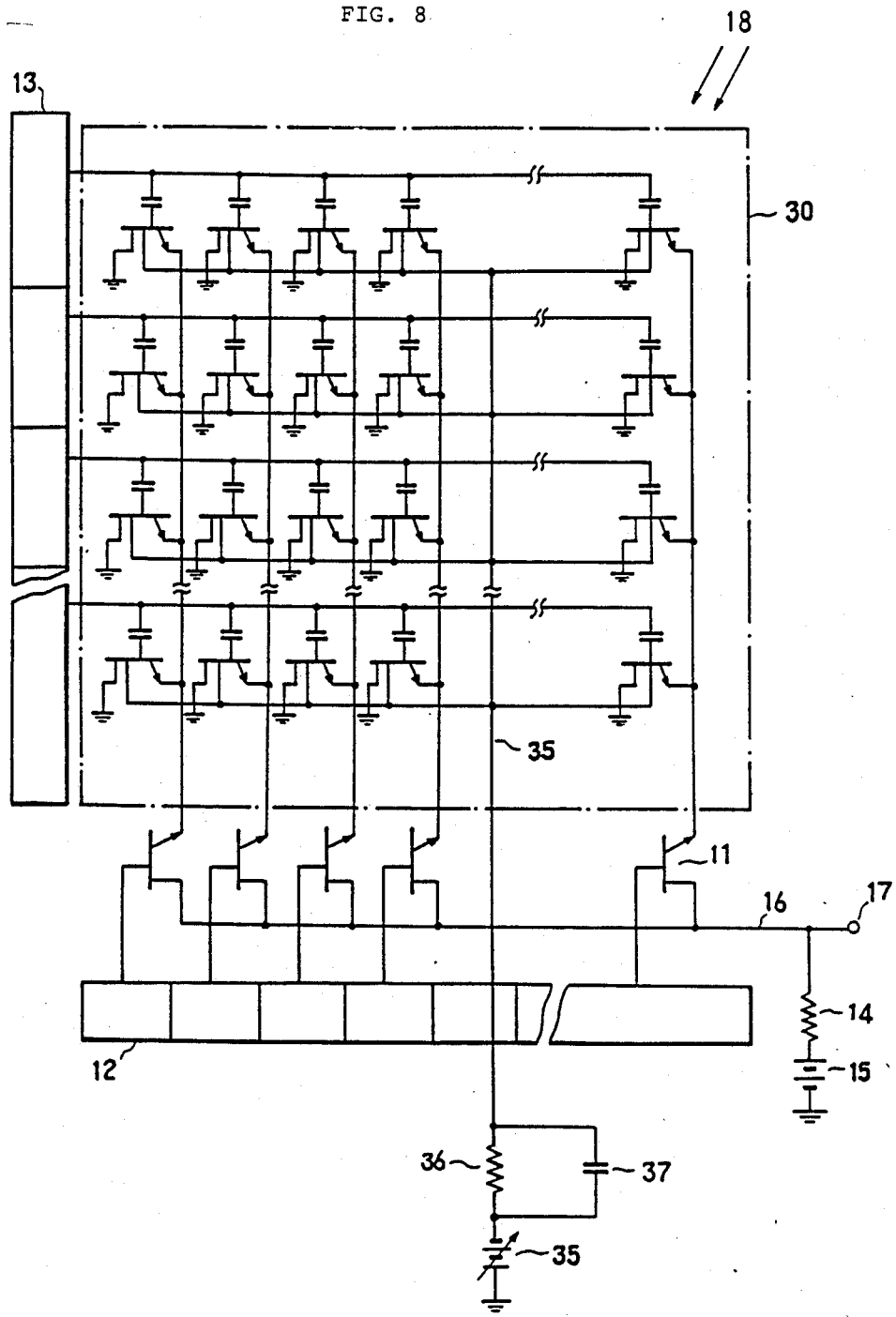
FIG. 8 illustrates an embodiment in which such SIT image sensors shown in FIGS. 2A to 6C are assembled into an area sensor of the x-y address system.

FIG. 8 illustrates an embodiment of the present invention being applied to image processing. Reference numeral 30 indicates a matrix of such photoconductive cells of the present invention as shown in FIGS. 2 to 6. The shielding gate of each cell is connected to a constant power source 35 so that it is grounded at the same potential as the electrode of the n+ substrate region 1 or has a fixed reverse bias potential. Such a matrix arrangement permits two-dimensional image detection.

Reference numeral 11 indicates a switching transistor for video line selecting use, which may be a static induction, MOS or bipolar transistor. Reference numeral 12 designates a video line selection circuit for generating the video line selecting pulse $\phi_S$, 13 a readout address circuit for generating the readout gate pulse $\phi_G$, 14 a load resistor and 15 a video voltage source.

The optical input 18 is applied to the photoconductive cell matrix 30 and signals of the photocells that become elements of a row and column are sequentially provided by the video line selection circuit and the readout address circuit to the output terminal 17. By transmitting the outputs at the terminal 17 to a display circuit in a sequential order, an image output can be obtained.

For an embodiment adapted to supply the shielding gate with a negative potential relative to the source electrode, there is a system of applying a bias via resistor $R_{SG}$ 36 to the shielding gate, or a system of applying a bias to the shielding gate via a parallel circuit of the resistor 36 and a capacitor $C_{SG}$ 37 of a large value, by which the separation of readout signals between the photoconductive cells can be improved.

It is also possible, of course, to form the photoconductive cell matrix and the peripheral circuits as an integrated circuit on a single substrate, and a SIT logical integrated circuit of a logic type such as I²L, CML, STL or ISL, which can be manufactured by the same process, and is easy to fabricate.

FIG. 9 shows the measured results of the optical dynamic characteristics of three cells in a 4×4 matrix into which devices of such a basic cell structure shown in section in FIG. 2B were integrated as illustrated in FIG. 8. In the basic cell (pixel) structure in FIG. 2B, the impurity density of the n⁻ layer 2 is $\sim 10^{13}$ cm$^{-3}$, the impurity densities of the control gate region 20 and the shielding gate region 21, which are the first and second p+ gates, are higher than $10^{19}$ cm$^{-3}$, the diffusion depths of the gates are 6 to 7 μm and the thickness of the n⁻ layer 2 is 8 to 10μ. The area of one cell is 100×100μ, and the entire length of the source is 120μ. In FIG. 9, the line A corresponds to the case where $W_1-W_2=2.0$ μm and the line B the case where $W_1-W_2=1.0$ μm. In the two cases the electrically common shielding gate is supplied with reverse biases $-1.8$ and $-1.5$ V, respectively, via a bias resistor $R_{SG}=1$ MΩ.

The results shown in FIG. 9 were obtained for the case in which the light integration time was 10 msec. The wavelength λ of the optical input is 6550 Å, and, when (1) the signal readout line selecting pulse $\phi_s$ is applied, (2) a video bias is then applied to cells 1-1, 1-2 and 1-3 arranged in a line and (3) the readout gate pulse $\phi_G$ is then applied (a gate pulse 5 V in height and 1 μsec in width), the optical information is read out in succession. The results are plotted on the ordinate, from which it is seen that the cells of both the chip A and the chip B are of low dispersion. Further, comparison of the chips with $W_1-W_2=2\mu$ and $W_1-W_2=1\mu$ indicates that the chip A with $W_1=W_2=2\mu$ apparently exhibits higher sensitivity to low light levels. It can be confirmed that the dynamic range for the light is in excess of 40 dB and the SN ratio also exceeds 40 dB. The dispersion in the optical dynamic characteristic is also less than 10% at a position where the saturation level is 50%. As described above, the embodiment of FIG. 2B is a vertical-structured image sensor and has its gate divided into two, with one being used for isolation, which provides for sufficiently increased integration density, and is designed so that only the other gate region and its vicinity are irradiated by light; therefore, this embodiment is excellent in photosensitivity and in the signal separation between adjacent cells.

When it is desired to produce a color display, the photoconductive cell matrix 30 is separated by color filters into, for example, red (R), green (G) and blue (B) for obtaining red, green and blue signals, by which a semiconductor image sensor for color display can be obtained.

According to the present invention, the photodetecting section is a high-sensitivity, high-speed photoconductive cell of a large dynamic range which is formed by the static induction transistor, and each photoconductive cell can be isolated enough by the shielding gate from adjacent cells, so that a semiconductor image sensor of high integration density can be obtained.

While the embodiments have been described being of the n-channel type, they may of course also be of the p-channel type. Also it is possible to adopt such a structure that uses a static induction transistor the channel of which is reverse in conductivity type from that in the foregoing. The gate may also be a Schottky barrier gate or MOS (MIS) gate. The material used is not limited specifically to silicon but may also be the Group III-V compound semiconcuctors (including mixed crystals, too), or compound semiconductors of the Groups II to VI, such as $Hg_xCd_{1-x}$.

Of course, for the interconnection of the photoconductive cell matrix, conventional digital memory techniques may be used, such as a two-layer interconnection of aluminum and polysilicon.

As has been described in the foregoing, the semiconductor image sensor of the present invention possesses such features as follows:

(1) The gate of either one of the drain and the source region is formed as the control gate and the other gate is formed as the shielding gater region, and the light amplification is always effected by the control gate region. That is, the functions of the two gates are separated with respect to light.

(2) The integration density is improved.

As will be appreciated from the foregoing, the semiconductor image sensor of the present invention has very excellent characteristics of high sensitivity, high integration density, low noise, large dynamic range and high SN ratio, in addition to the features that the photoconductive cells are isolated from the adjacent ones and that the integration density is raised; therefore, the present invention can be said to be of great industrial value.

I claim:

1. A semiconductor image sensor comprising
    a semiconductor substrate,
    a matrix of pluralities of row and column lines formed over said substrate,
    a static induction transistor located in the vicinity of each intersection of said row and column lines and connected respectively thereto, each said transistor serving as a photoconductive cell and a storage capacitor, each said transistor comprising a first main electrode connected to a respective one of the column lines, and a second main electrode connected in common to the second main electrodes of the other static induction transistors, a channel region defined in said substrate between said main electrodes and two control regions defined in said substrate at opposite sides of said first main electrode, a first one of said control regions being comprised in said photoconductive cell, and a first terminal of said capacitor being connected to said first control region and a second terminal of said capacitor being connected to one of said row lines, and the second of said control regions acting as a region for signal separation between adjacent ones of said photoconductive cells of said array, wherein, in order to increase the sensitivity of said photoconductive cell to input light, the distance between said first control region and said first main electrode is larger than the distance between the second control region and said first main electrode, a plurality of switching transistors each having a respective first electrode connected to a first end of a respective one of said column lines, and a respective second electrode connected in common to the second electrodes of the other switching transistors of the other columns, a series connection of a readout video load resistor and a power source connected to said second electrodes of said switching transistors, a video line selection circuit connected to a control electrode of each said switching transistor; and a readout address circuit connected via the respective capacitor to the control gate of each said photoconductive cell.

2. The sensor of claim 1, wherein the second control region serves as said region for signal separation between adjacent photoconductive cells as a result of its impurity density being higher than the impurity density of the control region forming the photoconductive cell.

3. The sensor of claim 1, wherein the second control region serves as said region for signal separation between adjacent photoconductive cells and the main electrode connected to the respective column line as a result of its impurity density being higher than the impurity density of the channel region between the other control region and said main electrode connected to the respective column line, and said other control region serves as a photoconductive cell.

4. The sensor of claim 1, wherein a diode portion formed by the second control region serving as the region for signal separation between adjacent photoconductive cells, the adjoining portion of the respective channel region and the respective first main electrode is shielded from said input light.

5. The sensor of claim 1, wherein the static induction transistors at said intersecting points are produced through isolation techniques using an insulating material.

6. The sensor of claim 1, wherein said larger distance is made sufficiently larger to provide a predetermined increase in said sensitivity of said photocell.

7. The sensor of claim 3, wherein said higher impurity density of said second control region is made sufficiently higher than that of said channel region to provide a predetermined amount of said separation between said adjacent photoconductive cells.

8. A semiconductor image sensor including a cell, comprising:

a semiconductor substrate including a high resistivity $n^-$ layer for providing a channel region;

first and second $p^+$ regions formed in said $n^-$ layer for providing a shielding gate region and a control gate region, respectively;

a first $n^+$ region formed in said $n^-$ layer between said first and second $p^+$ regions; and an insulated gate electrode formed over and insulated from said second $p^+$ region to provide a capacitance between said electrode and said second $p^+$ region, wherein said second $p^+$ region and said first $n^+$ region are spaced apart by a distance greater than the distance between said first $p^+$ region and said first $n^+$ region, so that the diffusion potential for minority carriers created in said channel region responsive to incident light is greater between said first $p^+$ region and said first $n^+$ region than between said second $p^+$ region and said first $n^+$ region.

9. The sensor of claim 8, wherein the impurity density of said shielding gate region is larger than the impurity density of said control gate region.

10. The sensor of claim 8, wherein a light shielding mask is provided over the surface of said substrate in the vicinity of said shielding gate region and the channel region between said shielding gate region and said first $n^+$ region.

11. The sensor of claim 8, wherein the depth of said shielding gate region is greater than the depth of said control gate region.

12. The sensor of claim 10, wherein the depth of said shielding gate region is greater than the depth of said control gate region.

13. The sensor of claim 8, wherein said channel region in the vicinity of said shielding gate region has a higher impurity density than said channel region in the vicinity of said control gate region.

14. The sensor of claim 10, wherein said channel region in the vicinity of said shielding gate region has a higher impurity density than said channel region in the vicinity of said control gate region.

15. The sensor of claim 8, comprising a plurality of said devices arranged in an array for sensing an image corresponding to the light inputs to said devices, and pluralities of row and column lines respectively connected to said devices for reading out a value corresponding to the amount of said light input received by each said device.

16. The sensor of claim 9, comprising a plurality of said devices arranged in an array for sensing an image corresponding to the light inputs to said devices, and pluralities of row and column lines connected to respective ones of said devices for reading out the amount of said light input received by each said device.

17. The sensor of claim 10, comprising a plurality of said devices arranged in an array for sensing an image corresponding to the light inputs to said devices, and pluralities of row and column lines connected to respective ones of said devices for reading out the amount of said light input received by each said device.

18. The sensor of claim 11, comprising
a plurality of said devices arranged in an array for sensing an image corresponding to the light inputs to said devices, and
pluralities of row and column lines connected to respective ones of said devices for reading out the amount of said light input received by each said device.

19. The sensor of claim 12, comprising
a plurality of said devices arranged in an array for sensing an image corresponding to said light input, and
pluralities of row and column lines connected to respective ones of said devices for reading out the amount of said light input received by each said device.

20. The sensor of claim 13, comprising
a plurality of said devices arranged in an array for sensing an image corresponding to said light input, and
pluralities of row and column lines connected to respective ones of said devices for reading out the amount of said light input received by each said device.

21. The sensor of claim 8, each said shielding gate region being formed to surround at the surface of said $n^-$ layer the respective first $n^+$ region and control gate region.

22. The sensor of claim 6, comprising said greater diffusion potential being made sufficiently greater to provide a predetermined sensitivity for the sensor.

23. The sensor of claim 9, wherein said impurity density of said shielding gate region is sufficiently larger than that of said control gate region to cause a sufficiently greater value of the respective diffusion potential to produce a predetermined sensitivity for the sensor.

24. The sensor claim 11, wherein said depth of said shielding gate region is sufficiently greater than that of said control gate region to cause a sufficiently greater value of the respective diffusion potential to provide a predetermined sensitivity for the sensor.

25. The sensor of claim 12, wherein said depth of said shielding gate region is sufficiently greater than that of said control gate region to cause a sufficiently greater value of the respective diffusion potential to provide a predetermined sensitivity for the sensor.

26. A semiconductor image sensor including a cell, comprising:
a semiconductor substrate including a high resistivity region for providing a channel region;
first and second regions formed at the surface of said high resistivity region, of a conductivity type for providing a shielding gate region and a control gate region, respectively;
a third region formed at the surface of said channel region between said first and second regions, for providing a first main electrode of a transistor; and
an insulated gate region formed over and insulated from said control gate region to provide a capacitance between said insulated gate region and said control gate region,
wherein said control gate region and said third region are spaced apart by a distance greater than the distance between said shielding gate region and said third region, so that the diffusion potential for minority carriers created in said channel region responsive to incident light is greater between said shielding gate region and said third region than between said control gate region and said third region.

27. The semiconductor image sensor of claim 26, comprising a fourth region formed in contact with said channel region in opposing relation to said third region for providing a second main electrode of said transistor.

28. The sensor of claim 27, wherein said fourth region comprises a further layer under said layer for providing said channel region.

29. The sensor of claim 28, wherein said first and second regions are of $p^+$ type conductivity, said third region and said further layer are of $n^+$ type conductivity, and said high resistivity substrate constitutes said layer for providing said channel region and is of $n^-$ type conductivity.

30. The sensor of claim 28, wherein said channel region is of the $p^-$ channel type.

31. The sensor of claim 28, wherein said channel region is of the $n^-$ channel type.

32. The sensor of claim 26, wherein said first region is biased with respect to said third region.

33. The sensor of claim 26, comprising a light shield formed over said shielding gate region and over a part of said channel region adjacent said shielding gate region.

34. The semiconductor image sensor of claim 26, wherein said shielding gate region has a higher impurity density than that of said control gate region, so that the diffusion potential for minority carriers created in said channel region responsive to incident light is greater between said shielding gate region and said third region than between said control gate region and said third region.

35. The semiconductor image sensor of claim 26, wherein the portion of said channel region between said shielding gate region and said third region has a higher impurity density than that of the other portion of said channel region, so that the diffusion potential for minority carriers created in said channel region responsive to incident light is greater between said shielding gate region and said third region than between said control gate region and said third region.

36. The semiconductor image sensor of claim 26, wherein said shielding gate region is formed deeper than said control gate region, so that the diffusion potential for minority carriers created in said channel region responsive to incident light is greater between said shielding gate region and said third region than between said control gate region and said third region.

* * * * *

UNITED STATES PATENT AND TRADEMARK OFFICE
CERTIFICATE OF CORRECTION

PATENT NO. : 4,673,985

DATED : JUNE 16, 1987

INVENTOR(S) : JUN-ICHI NISHIZAWA

It is certified that error appears in the above-identified patent and that said Letters Patent is hereby corrected as shown below:

FRONT PAGE, [73] Assignee, "Fuji Photo Film Co., Ltd., Minami-ashigara, Japan" should be --Jun-ichi Nishizawa, Sendai, Japan--.

IN THE DRAWINGS

The first figure on Sheet 1 of 10 of the drawings should be labelled --FIG. 1A--.

Col. 1, line 6, before "each" insert --that--;
line 37, "shown" should be --shown in--.

Col. 5, line 10, "of" should be --the--;
line 22, "cells as," should be --cells, as--;
line 28, "a" should be --followed by--.

Col. 6, line 41, "gistance" should be --sistance--.

Col. 7, line 68, "$W_1=W_2=2\mu$" should be --$W_1-W_2=2\mu$--.

Col. 8, line 28, "described" should be --described as--;
line 36, "semiconcuctors" should be --semiconductors--;

UNITED STATES PATENT AND TRADEMARK OFFICE
CERTIFICATE OF CORRECTION

PATENT NO. : 4,673,985

DATED : JUNE 16, 1987

INVENTOR(S) : JUN-ICHI NISHIZAWA

It is certified that error appears in the above-identified patent and that said Letters Patent is hereby corrected as shown below:

Col. 8, line 48, "gater" should be --gate--.

Col. 11, line 31, "6," should be --8,--.

Signed and Sealed this

Nineteenth Day of March, 1991

*Attest:*

HARRY F. MANBECK, JR.

*Attesting Officer*  *Commissioner of Patents and Trademarks*